US011894458B2

(12) United States Patent
Wei et al.

(10) Patent No.: US 11,894,458 B2
(45) Date of Patent: Feb. 6, 2024

(54) LATERAL DOUBLE-DIFFUSED METAL OXIDE SEMICONDUCTOR FIELD EFFECT TRANSISTOR

(71) Applicants: SOUTHEAST UNIVERSITY, Jiangsu (CN); CSMC TECHNOLOGIES FAB2 CO., LTD., Wuxi (CN)

(72) Inventors: Jiaxing Wei, Wuxi (CN); Qichao Wang, Wuxi (CN); Kui Xiao, Wuxi (CN); Dejin Wang, Wuxi (CN); Li Lu, Wuxi (CN); Ling Yang, Wuxi (CN); Ran Ye, Wuxi (CN); Siyang Liu, Wuxi (CN); Weifeng Sun, Wuxi (CN); Longxing Shi, Wuxi (CN)

(73) Assignees: SOUTHEAST UNIVERSITY, Jiangsu (CN); CSMC TECHNOLOGIES FAB2 CO., LTD., Wuxi (CN)

( * ) Notice: Subject to any disclaimer, the term of this patent is extended or adjusted under 35 U.S.C. 154(b) by 44 days.

(21) Appl. No.: 17/762,206

(22) PCT Filed: Sep. 25, 2020

(86) PCT No.: PCT/CN2020/117572
§ 371 (c)(1),
(2) Date: Oct. 7, 2022

(87) PCT Pub. No.: WO2021/120766
PCT Pub. Date: Jun. 24, 2021

(65) Prior Publication Data
US 2023/0019004 A1 Jan. 19, 2023

(30) Foreign Application Priority Data
Dec. 18, 2019 (CN) .......................... 201911310548.5

(51) Int. Cl.
*H01L 29/78* (2006.01)

(52) U.S. Cl.
CPC .............................. *H01L 29/7825* (2013.01)

(58) Field of Classification Search
CPC ......... H01L 29/06; H01L 29/08; H01L 29/36; H01L 29/66; H01L 29/78; H01L 29/423;
(Continued)

(56) References Cited

U.S. PATENT DOCUMENTS

| 2011/0024836 A1 | 2/2011 | Zinn | |
| 2012/0273883 A1* | 11/2012 | Chen | H01L 29/66659 438/289 |

(Continued)

FOREIGN PATENT DOCUMENTS

| CN | 101714577 | 5/2010 |
| CN | 106024858 | 10/2016 |

(Continued)

OTHER PUBLICATIONS

Chinese Office Action for corresponding Chinese Application No. 201911310548.5, dated May 5, 2022, 7 pages.
(Continued)

*Primary Examiner* — Chuong A Luu
(74) *Attorney, Agent, or Firm* — Dority & Manning, PA

(57) ABSTRACT

A lateral double-diffused metal oxide semiconductor field effect transistor (LDMOS), including: a trench gate including a lower part inside a trench and an upper part outside the trench, a length of the lower part in a width direction of a conducting channel being less than that of the upper part, and the lower part extending into a body region and having a depth less than that of the body region; an insulation structure arranged between a drain region and the trench gate and extending downwards into a drift region, a depth of the insulation structure being less than that of the drift region.

15 Claims, 2 Drawing Sheets

(58) Field of Classification Search
CPC ............. H01L 29/0653; H01L 29/0692; H01L 29/4236; H01L 29/7825; H01L 29/42368; H01L 29/365; H01L 29/42376; H01L 29/0856; H01L 29/0869; H01L 29/0873; H01L 29/0886; H01L 29/7833; H01L 29/7836; H01L 29/7813; H01L 29/7816; H01L 29/66704; H01L 29/66734; H01L 29/66681
USPC ......................................................... 257/343
See application file for complete search history.

(56) References Cited

U.S. PATENT DOCUMENTS

| | | | |
|---|---|---|---|
| 2016/0099340 A1 | 4/2016 | Hsu | |
| 2016/0351707 A1* | 12/2016 | Kim | ...................... H01L 29/402 |
| 2017/0040422 A1* | 2/2017 | Jung | ...................... H01L 28/00 |
| 2022/0130967 A1* | 4/2022 | Wang | .................. H01L 29/7816 |

FOREIGN PATENT DOCUMENTS

| | | |
|---|---|---|
| CN | 106935647 | 7/2017 |
| CN | 107342325 | 11/2017 |
| CN | 107910357 | 4/2018 |

OTHER PUBLICATIONS

PCT International Search Report and Written Opinion (w/ English translations) for corresponding Chinese Application No. PCT/CN2020/117572, dated Jan. 7, 2021, 10 pages.
Wei et al., "A Split Triple-Gate Power LDMOS With Improved Static-State and Switching Performance," IEEE Transactions On Electron Devices, vol. 66, No. 6, Jun. 2019, pp. 2669-2674.

* cited by examiner

LATERAL DOUBLE-DIFFUSED METAL OXIDE SEMICONDUCTOR FIELD EFFECT TRANSISTOR

CROSS-REFERENCES TO RELATED APPLICATIONS

This application is a national stage of PCT Patent Application No. PCT/CN2020/117572, entitled "LATERAL DOUBLE-DIFFUSED METAL OXIDE SEMICONDUCTOR FIELD EFFECT TUBE," filed on Sep. 25, 2020; which claims priority to Chinese application No. 2019113105485, entitled "LATERAL DOUBLE-DIFFUSED METAL OXIDE SEMICONDUCTOR FIELD EFFECT TUBE," filed on Dec. 18, 2019, the contents of both of which are incorporated by reference herein in their entirety for all purposes.

TECHNICAL FIELD

The present disclosure relates to the field of semiconductor manufacturing, and in particular, to a lateral double-diffused metal oxide semiconductor field effect transistor.

BACKGROUND

Lateral double-diffused metal oxide semiconductor field effect transistors (Lateral Double-Diffused MOSFET, LDMOS for short) in power devices have advantages such as fast switching, large output power, high linear gain and good durability. At the same time, LDMOS devices are based on a mature silicon technology, which makes their production costs low. Therefore, the LDMOS devices gradually replace silicon bipolar power devices and are widely used in fields of, for example, power management, display drive and automotive electronics.

Compared with ordinary MOS devices, traditional LDMOS devices mostly have a drift region. The drift region increases a breakdown voltage of the devices. A high breakdown voltage may increase output power and power density. Due to a low doping concentration in the drift region, on-resistance of the devices may increase. Therefore, for LDMOS devices, it is very important to coordinate a relationship between the breakdown voltage and the on-resistance. However, due to the limitation of materials, there is a contradiction between the breakdown voltage and the on-resistance. Therefore, there is a need to balance the contradiction between the two in actual designs.

SUMMARY

In view of the above, there is a need to provide an LDMOS with low on-resistance.

An LDMOS, including a source region of a first conductivity type; a drain region of the first conductivity type; a drift region of the first conductivity type; a bulk region of a second conductivity type; a field oxide layer located on a surface of the drift region; a trench gate including a lower part inside a trench and an upper part outside the trench, a length of the lower part in a width direction of a conducting channel being less than that of the upper part in the width direction of the conducting channel, and the lower part extending into the bulk region and having a depth less than that of the bulk region; and an insulation structure arranged between the drain region and the trench gate and extending downwards into the drift region, a depth of the insulation structure being less than that of the drift region, a depth of the insulation structure in the drift region being greater than that of the field oxide layer in the drift region, a length of the insulation structure in the width direction of the conducting channel being less than that of the drift region in the width direction of the conducting channel, the field oxide layers being formed on surfaces of two sides of the insulation structure in the width direction of the conducting channel, and the upper part extending onto the field oxide layer.

Details of one or more embodiments of the present application are set forth in the following accompanying drawings and descriptions. Other features, objectives, and advantages of the present application will become obvious with reference to the specification, the accompanying drawings, and the claims.

BRIEF DESCRIPTION OF THE DRAWINGS

In order to better describe and illustrate embodiments and/or examples of those inventions disclosed herein, reference may be made to one or more accompanying drawings. Additional details or examples used to describe the accompanying drawings should not be considered as limitations on the scope of any of the disclosed inventions, the presently described embodiments and/or examples, and the presently understood best mode of these inventions.

DETAILED DESCRIPTION OF THE EMBODIMENTS

Figure 1:
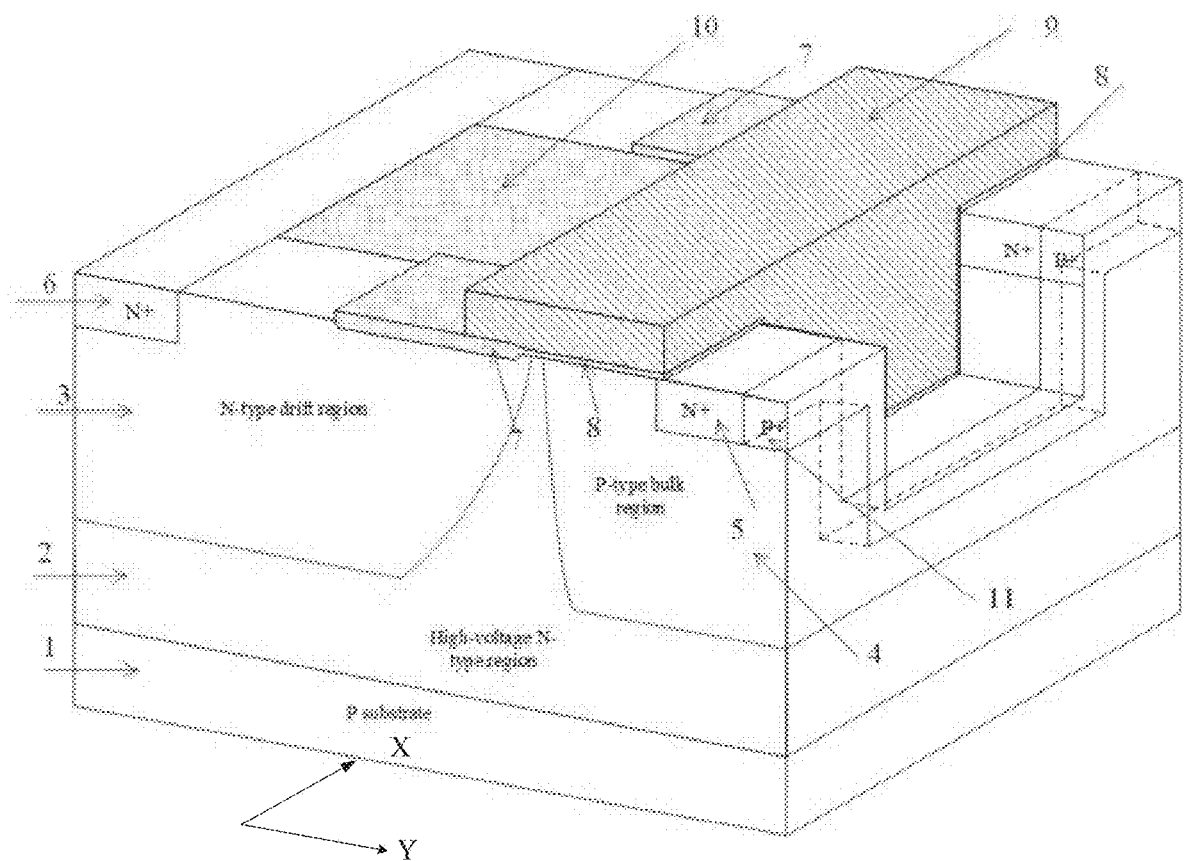
FIG. 1 is a perspective view of a main structure of an LDMOS according to an embodiment.

For easy understanding of the present disclosure, a more comprehensive description of the present disclosure is given below with reference to the accompanying drawings. Preferred embodiments of the present disclosure are given in the accompanying drawings. However, the present disclosure may be implemented in many different forms and is not limited to the embodiments described herein. However, the present disclosure may be implemented in many different forms and is not limited to the embodiments described herein.

Unless otherwise defined, all technical and scientific terms used herein have the same meaning as commonly understood by those of ordinary skill in the art to which the present disclosure belongs. The terms used in the specification of the present disclosure are intended only to describe particular embodiments and are not intended to limit the present disclosure. The term "and/or" used herein includes any and all combinations of one or more of the associated listed items.

It should be understood that when an element or layer is referred to as being "on", "adjacent to", "connected to", or "coupled to" another element or layer, the element or layer may be directly on, adjacent to, connected to, or coupled to the another element or layer, or an intervening element or layer may be disposed therebetween. On the contrary, when an element is referred to as being "directly on", "directly adjacent to", "directly connected to", or "directly coupled to" another element or layer, no intervening element or layer is disposed therebetween. It should be understood that although terms such as first, second, and third may be used to describe various elements, components, regions, layers and/or portions, the elements, components, regions, layers and/or portions may not be limited to such terms. Such terms are used only to distinguish one element, component, region, layer or portion from another element, component, region, layer or portion. Thus, without departing from the teaching of the present application, a first element, component, region, layer or portion may be referred to as a second element, component, region, layer or portion.

Spatial relationship terms such as "under", "underneath", "below", "beneath", "over", and "above" may be used for illustrative purposes to describe a relationship between one element or feature and another element or feature illustrated in the figures. It should be understood that, in addition to the orientations illustrated in the figures, the spatial relationship terms are intended to further include different orientations of the device in use and operation. For example, if the device in the drawings is flipped, the element or feature described as "below", "underneath" or "under" another element or feature may be oriented as "on" the another element or feature. Thus, the exemplary terms "below" and "under" may include two orientations of above and below. The device may include additional orientations (e.g., 90-degree rotation or other orientations), and thus spatial descriptors used herein may be interpreted accordingly.

The term used herein is intended only to describe specific embodiments and not a limitation on the present disclosure. In use, the singular forms of "a/an", "one", and "the" may also include plural forms, unless otherwise clearly specified by the context. It should be further understood that the terms "form" and/or "include/comprise", when used in the specification, specify the presence of the features, integers, steps, operations, elements and/or components, but may not exclude the presence or addition of one or more of other features, integers, steps, operations, elements, components and/or their combinations. When used herein, the term "and/or" may include any and all combinations of related listed items.

Embodiments of the present disclosure are described herein with reference to cross-sectional views of schematic diagrams of ideal embodiments (and intermediate structures) of the present disclosure. In this way, illustrated shape variations caused by, for example, manufacturing techniques and/or tolerances, may be expected. Thus, the embodiments of the present disclosure may not be limited to the specific shapes of the regions illustrated herein, but may include shape deviations caused by, for example, manufacturing. For example, an injection region illustrated as a rectangle, typically, has rounded or curved features and/or a gradient of injection concentration at its edges rather than a binary change from an injection region to a non-injection region. Likewise, a buried region formed by injection may result in some injection in the region between the buried region and a surface through which the injection takes place. Thus, the region shown in the figures is generally schematic, and the illustrated shape is not intended to show the actual shape of the region of the device, and is not intended to limit the scope of the present disclosure.

The vocabulary in the semiconductor field used herein is a technical vocabulary commonly used by those skilled in the art. For example, for P– type and N– type impurities, in order to distinguish doping concentration, it is simple to use P+ type to represent P type of heavy doping concentration, use P type to represent P type of medium doping concentration, use P– type to represent P type of light doping concentration, use N+ type to represent N type of the heavy doping concentration, use N type to represent N type of the medium doping concentration, and use N– type to represent N type of the light doping concentration.

For devices with large operating current, their on-resistance is required to be high, and there is a need to reduce their resistance under a condition of ensuring a breakdown voltage. Generally, the on-resistance is reduced by adjusting a doping concentration in a drift region. However, since the breakdown voltage may decrease as the doping concentration increases, additional structures such as field plate and shallow trench isolation (STI) technologies are also needed to ensure the breakdown voltage. In addition, this may also be implemented by adjusting a flow path of a current in the drift region, or by adjusting a length of the drift region even if the path of the current in the drift region is short. At present, a number of new related structures have emerged from these considerations, including Reduced SURface Field (RESURF) and piecewise linear doping technologies. However, when such structures decrease the on-resistance, the breakdown voltage may also be reduced accordingly. Thus, additional measures are needed to ensure that the on-resistance and the breakdown voltage both meet a design objective, which greatly changes an overall structure of the device.

Figure 2:
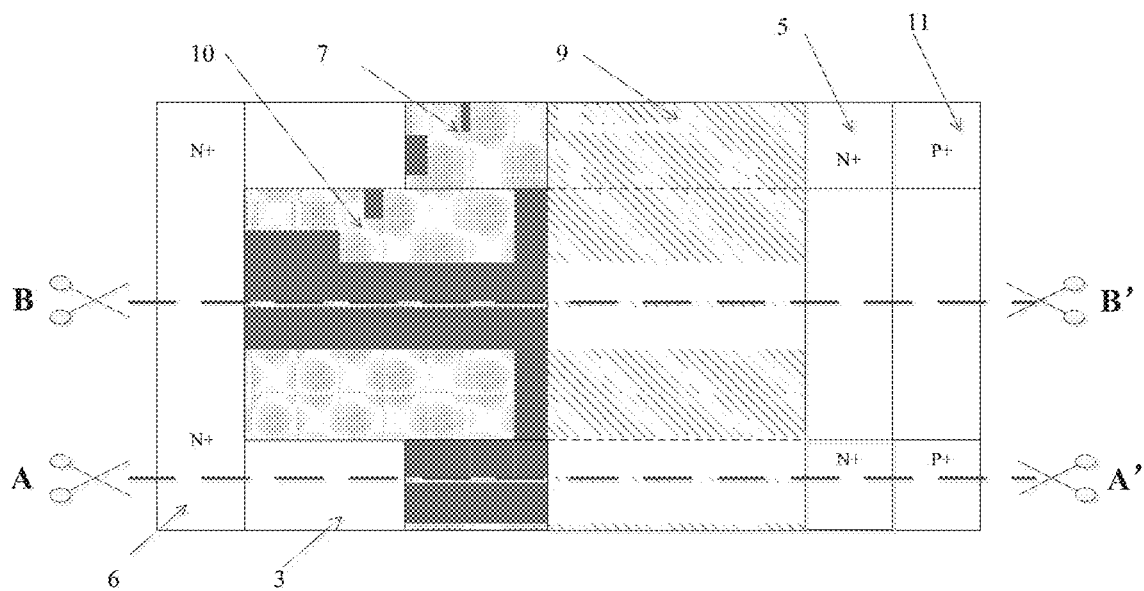
FIG. 2 is a top view of the main structure of the IBMS according to an embodiment.
Figure 3:
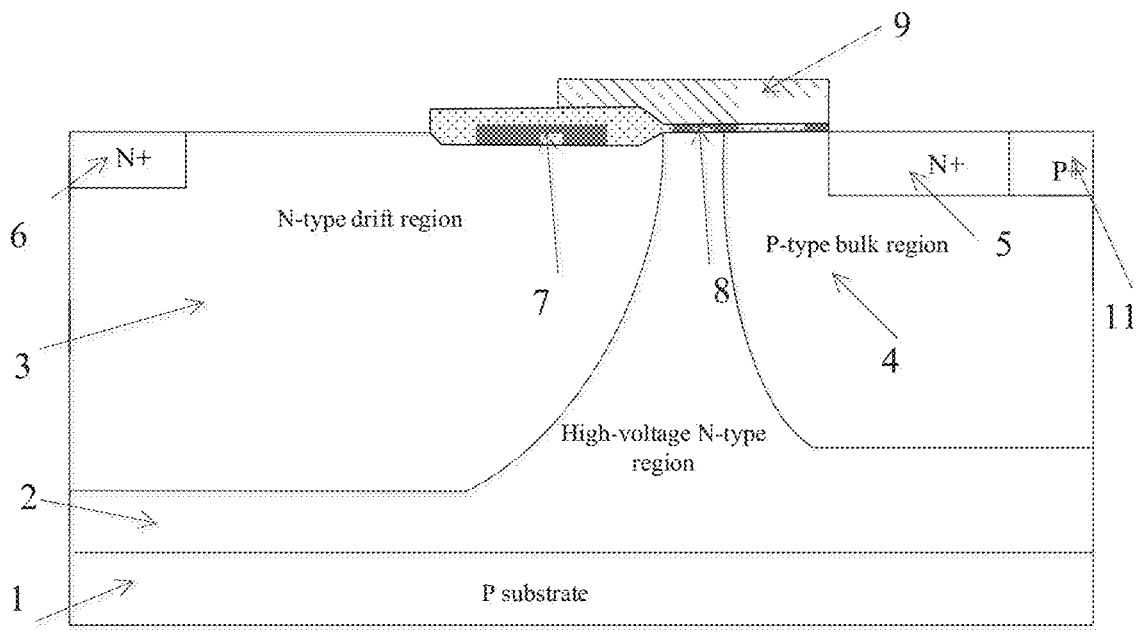
FIG. 3 is a schematic diagram of a sectional structure of a device taken along a section AA' in FIG. 2.
Figure 4:
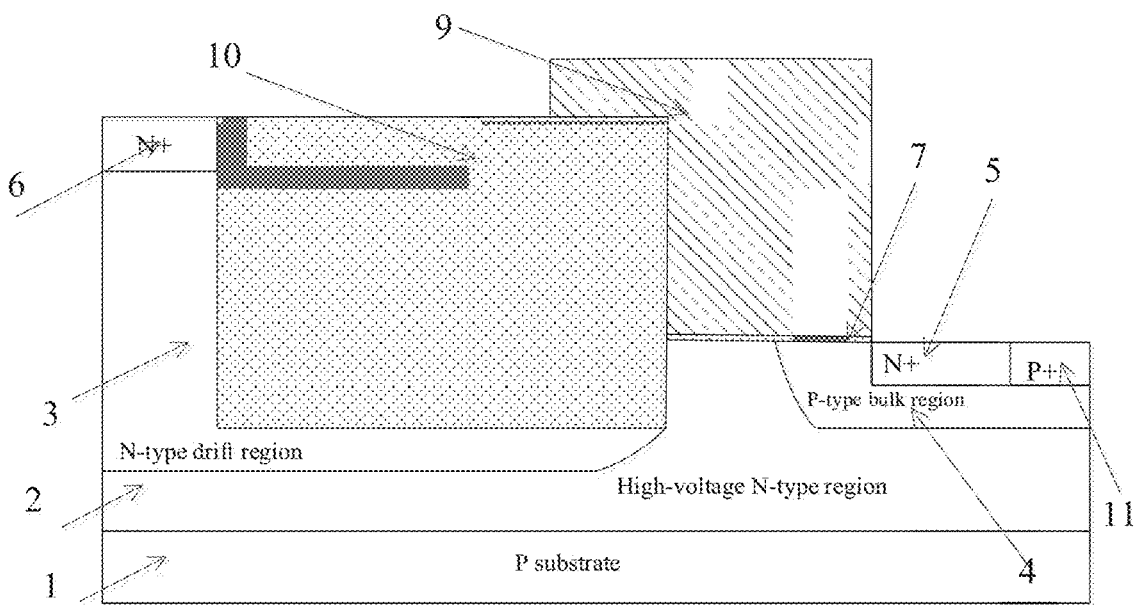
FIG. 4 is a schematic diagram of a sectional structure of the device taken along a section BB' in FIG. 2.

FIG. 1 is a perspective view of a main structure of an LDMOS according to an embodiment, FIG. 2 is a top view of the main structure of the LDMOS according to an embodiment, FIG. 3 is a schematic diagram of a sectional structure of a device taken along a section AA' in FIG. 2, and FIG. 4 is a schematic diagram of a sectional structure of the device taken along a section BB' in FIG. 2.

A drain region 6, a source region 5, a drift region 3, a bulk region 4, a field oxide layer 7, an insulation structure 10 and a trench gate are included. The source region, the drain region and the drift region have a first conductivity type, and the bulk region has a second conductivity type. In this embodiment, the first conductivity type is N– type, and the second conductivity type is P– type. In another embodiment, the first conductivity type is P– type, and the second conductivity type is N– type. Specifically, in the embodiment shown in FIG. 1, the source region 5 is a heavily doped N+ source, and the drain region 6 is a heavily doped N+ drain.

In the embodiment shown in FIG. 1, the trench gate includes a polysilicon gate 9 and a gate dielectric layer 8 below the polysilicon gate 9. The polysilicon gate 9 includes a lower part inside a trench and an upper part outside the trench. The lower part extends into the bulk region 4, and a depth of the lower part is less than that of the bulk region 4. A length of the power part in a width direction of a conducting channel is less than that of the upper part in the width direction of the conducting channel. Different from the conventional art of forming a conducting channel only on the surface of the bulk region 4, the above scheme of arranging a trench gate in the bulk region 4 can extend the path of the current (conducting channel) to almost the entire three-dimensional bulk region 4. In this way, the current density can be greatly increased under the same device size and operating condition. That is, the on-resistance is greatly reduced. In FIG. 1, the width direction of the conducting channel is an X-axis direction, and a length direction of the conducting channel is a Y-axis direction. In one embodiment, the gate dielectric layer 8 is made of silicon oxide, such as silicon dioxide.

The insulation structure 10 is arranged between the drain region 6 and the trench gate and extends downwards into the drift region 3. A depth of the insulation structure 10 is less than that of the drift region 3, a depth of the insulation structure 10 in the drift region 3 is greater than that of the field oxide layer 7 in the drift region 3, and a length of the insulation structure 10 in the width direction of the conducting channel is less than that of the drift region 3 in the width direction of the conducting channel. The field oxide layers 7 are formed on two sides of the insulation structure 10 (two sides in the width direction of the conducting channel) and on the surface of the drift region 3. The upper part of the polysilicon gate 9 is partially extended to the field oxide layer 7 and partially arranged on the gate dielectric layer 8. The gate dielectric layer 8 is also formed on a bottom and a wall of the trench gate.

According to the LDMOS, the insulation structure is arranged in the drift region and the trench gate is arranged in the bulk region, so that the planar conducting channel formed only on the surfaces of the drift region and the bulk region in the conventional art is transformed into a three-dimensional structure arranged around the insulation structure and the trench gate in the drift region and the bulk region. The length of the insulation structure in the width direction of the conducting channel is less than that of the drift region in the width direction of the conducting channel, so that certain drift regions are retained on two sides of the insulation structure as a current channel to prevent the only passage of the current from below the insulation structure. Since the conducting channel of the device is transformed into the three-dimensional structure, the current path is expanded when the device is turned on. Under a same operating condition, an increase in the current path is equivalent to a decrease in the on-resistance. In this way, the current density can be greatly increased under the same device size and operating condition when the device is turned on. That is, the on-resistance is greatly reduced. At the same time, the insulation structure in the drift region may effectively improve voltage resistance performance of the device and assist in depletion, thereby allowing the doping concentration in the drift region to be increased, which further reduces the on-resistance. Moreover, the improvement of the LIMOS on the structure of the device is different from traditional structures such as a field plate structure and a RESURF structure.

Referring to FIG. 1, the LDMOS further includes a substrate 1 of the second conductivity type, and a first-conductivity-type region 2 on the substrate 1. In the embodiment shown in FIG. 1, the substrate 1 is a P substrate, the first-conductivity-type region 2 is a high-voltage N− type region, and the doping concentration of the first-conductivity-type region 2 may be adjusted according to a design objective of voltage resistance of the device.

In one embodiment, the length of the insulation structure 10 in the width direction of the conducting channel is less than that of the drain region 6 in the width direction of the conducting channel.

In one embodiment, a length of a lower part of the poly silicon gate 9 in the width direction of the conducting channel is less than that of the bulk region 4 in the width direction of the conducting channel.

In one embodiment, the insulation structure 10 is made of silicon oxide, such as silicon dioxide.

In one embodiment, the depth of the insulation structure 10 is greater than that of the trench gate. Preferably, the insulation structure 10 is 0.1 to 0.4 microns deeper than the trench gate.

In one embodiment, the depth of the drift region 3 is greater than that of the bulk region 4.

In the embodiment shown in FIG. 1, the bulk region 4 is further provided with an electrode groove adjacent to the trench gate, and the electrode groove is arranged on a side of the trench gate away from the insulation structure 10. A metal electrode may be deposited in the electrode groove in a subsequent process.

In the embodiment shown in FIG. 1, the LDMOS further includes a contact region 11 arranged in the bulk region 4. The contact region 11 has the second conductivity type, and may specifically be a heavily doped P+ contact region. The contact region 11 is a U-shaped structure extending along a wall and a bottom of the electrode groove to the other side of the electrode groove in the width direction of the conducting channel. In the embodiment shown in FIG. 1, the contact region 11 is arranged next to the source region 5.

In one embodiment, the insulation structure 10 and the lower part of the polysilicon gate 9 are equal in length in the width direction of the conducting channel. Further, a length of the electrode groove in the width direction of the conducting channel may also be equal to the length of the insulation structure 10 and the length of the polysilicon gate 9.

The above embodiments only describe several implementations of the present disclosure, which are described specifically and in detail, and therefore cannot be construed as a limitation on the patent scope of the invention. It should be pointed out that those of ordinary skill in the art may also make several changes and improvements without departing from the ideas of the present disclosure, all of which fall within the protection scope of the present disclosure. Therefore, the patent protection scope of the present disclosure shall be subject to the appended claims.

What is claimed is:

1. A lateral double-diffused metal oxide semiconductor field effect transistor, comprising:
   a source region of a first conductivity type;
   a drain region of the first conductivity type;
   a drift region of the first conductivity type;
   a bulk region of a second conductivity type;
   a field oxide layer located on a surface of the drift region;
   a trench gate comprising a lower part inside a trench and an upper part outside the trench, a length of the lower part in a width direction of a conducting channel being less than that of the upper part in the width direction of the conducting channel, and the lower part extending into the bulk region and having a depth less than that of the bulk region; and
   an insulation structure arranged between the drain region and the trench gate and extending downwards into the drift region, a depth of the insulation structure being less than that of the drift region, a depth of the insulation structure in the drift region being greater than that of the field oxide layer in the drift region, a length of the insulation structure in the width direction of the conducting channel being less than that of the drift region in the width direction of the conducting channel, the field oxide layers being formed on surfaces of two sides of the insulation structure in the width direction of the conducting channel, and the upper part extending onto the field oxide layer; the first conductivity type and the second conductivity type being opposite conductivity types.

2. The lateral double-diffused metal oxide semiconductor field effect transistor according to claim 1, wherein the insulation structure is made of silicon oxide.

3. The lateral double-diffused metal oxide semiconductor field effect transistor according to claim 1, wherein the trench gate comprises a polysilicon gate and a gate dielectric layer under the polysilicon gate.

4. The lateral double-diffused metal oxide semiconductor field effect transistor according to claim 3, wherein the bulk region is further provided with an electrode groove adjacent to the trench gate, the electrode groove being arranged on a side of the trench gate away from the insulation structure.

5. The lateral double-diffused metal oxide semiconductor field effect transistor according to claim 4, further comprising a contact region arranged in the bulk region, the contact region having the second conductivity type, and the contact region being a U-shaped structure extending along a wall and a bottom of the electrode groove to the other side of the electrode groove in the width direction of the conducting channel.

6. The lateral double-diffused metal oxide semiconductor field effect transistor according to claim 4, wherein the electrode groove, the insulation structure and the polysilicon gate are equal in length in the width direction of the conducting channel.

7. The lateral double-diffused metal oxide semiconductor field effect transistor according to claim 3, wherein the polysilicon gate of the upper part of the trench gate is partially extended to the field oxide layer and partially arranged on the gate dielectric layer.

8. The lateral double-diffused metal oxide semiconductor field effect transistor according to claim 7, wherein a length of the polysilicon gate of the lower part of the trench gate in the width direction of the conducting channel is less than that of the bulk region in the width direction of the conducting channel.

9. The lateral double-diffused metal oxide semiconductor field effect transistor according to claim 1, wherein the depth of the insulation structure is greater than that of the trench gate.

10. The lateral double-diffused metal oxide semiconductor field effect transistor according to claim 9, wherein the insulation structure is 0.1 to 0.4 microns deeper than the trench gate.

11. The lateral double-diffused metal oxide semiconductor field effect transistor according to claim 1, wherein the depth of the drift region is greater than that of the bulk region.

12. The lateral double-diffused metal oxide semiconductor field effect transistor according to claim 1, wherein the insulation structure and the lower part are equal in length in the width direction of the conducting channel.

13. The lateral double-diffused metal oxide semiconductor field effect transistor according to claim 1, further comprising a substrate of the second conductivity type, and a first-conductivity-type region on the substrate.

14. The lateral double-diffused metal oxide semiconductor field effect transistor according to claim 1, wherein the length of the insulation structure in the width direction of the conducting channel is less than that of the drain region in the width direction of the conducting channel.

15. The lateral double-diffused metal oxide semiconductor field effect transistor according to claim 1, wherein the first conductivity type is N− type, and the second conductivity type is P− type.

* * * * *